United States Patent
Jin et al.

(10) Patent No.: US 11,355,351 B2
(45) Date of Patent: Jun. 7, 2022

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Jisong Jin, Shanghai (CN); Yanhua Wu, Shanghai (CN); Junling Pang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 76 days.

(21) Appl. No.: 16/856,177

(22) Filed: Apr. 23, 2020

(65) Prior Publication Data
US 2020/0343101 A1    Oct. 29, 2020

(30) Foreign Application Priority Data

Apr. 23, 2019 (CN) .......................... 201910330057.0

(51) Int. Cl.
*H01L 21/311* (2006.01)
(52) U.S. Cl.
CPC .. *H01L 21/31144* (2013.01); *H01L 21/31116* (2013.01)

(58) Field of Classification Search
None
See application file for complete search history.

(56) References Cited

U.S. PATENT DOCUMENTS

| | | | | |
|---|---|---|---|---|
| 9,911,604 | B1* | 3/2018 | Sun | H01L 21/0337 |
| 10,566,207 | B2* | 2/2020 | Kim | H01L 21/3086 |
| 10,714,343 | B1* | 7/2020 | Chen | H01L 21/31111 |
| 10,790,155 | B2* | 9/2020 | Liu | H01L 21/0274 |
| 2017/0125248 | A1* | 5/2017 | Siew | H01L 21/0332 |
| 2020/0251348 | A1* | 8/2020 | Jisong | H01L 21/31144 |
| 2020/0279737 | A1* | 9/2020 | Jin | H01L 21/76877 |
| 2020/0279738 | A1* | 9/2020 | Shi | H01L 21/31144 |
| 2020/0279739 | A1* | 9/2020 | Jin | H01L 21/0276 |
| 2020/0279740 | A1* | 9/2020 | Jin | H01L 21/47576 |
| 2020/0279741 | A1* | 9/2020 | Shi | H01L 21/31111 |
| 2020/0294810 | A1* | 9/2020 | Jin | H01L 21/0214 |

(Continued)

*Primary Examiner* — Allan W. Olsen
(74) *Attorney, Agent, or Firm* — Anova Law Group, PLLC

(57) ABSTRACT

A semiconductor device and its fabrication method are provided. The method includes providing a layer to be etched; forming a first mask layer on the layer to be etched; forming a first trench and a second trench in the first mask layer; forming a blocking layer over the first mask layer, where a portion of the blocking layer is formed in a first portion of the first trench and a first portion of the second trench; forming a first dividing layer in a first blocking opening to divide the first trench along a first direction; when forming the first dividing layer, forming second dividing layers on two sidewalls of a second blocking opening and arranged along the first direction, where the second dividing layers divide the second trench along the first direction; and after forming the first dividing layer and the second dividing layers, removing the blocking layer.

15 Claims, 13 Drawing Sheets

(56) References Cited

U.S. PATENT DOCUMENTS

| | | | |
|---|---|---|---|
| 2020/0335355 A1* | 10/2020 | Jin | H01L 21/31144 |
| 2020/0343100 A1* | 10/2020 | Sun | H01L 21/31144 |
| 2021/0104409 A1* | 4/2021 | Kim | H01L 21/02444 |
| 2021/0280423 A1* | 9/2021 | Jin | H01L 21/31144 |
| 2021/0280458 A1* | 9/2021 | Jin | H01L 21/31144 |
| 2021/0391173 A1* | 12/2021 | Chen | H01L 21/76816 |

* cited by examiner

SEMICONDUCTOR DEVICE AND FABRICATION METHOD THEREOF

CROSS-REFERENCE TO RELATED APPLICATION

This application claims the priority of Chinese Patent Application No. 201910330057.0, filed on Apr. 23, 2019, the content of which is incorporated herein by reference in its entirety.

TECHNICAL FIELD

The present disclosure generally relates to the field of semiconductor manufacturing and, more particularly, relates to a semiconductor device and its fabrication method.

BACKGROUND

In the semiconductor device manufacturing process, a mask pattern may be transferred to a substrate using a photolithographic process. The photolithographic process may include providing a substrate, forming a photoresist on the substrate, exposing and developing the photoresist to form a patterned photoresist, such that the mask pattern is transferred to the photoresist; etching the substrate using the patterned photoresist as the mask, such that the pattern on the photoresist is transferred to the substrate; and removing the photoresist.

With the continuous reduction of the semiconductor device size, the critical dimension of photolithography may gradually approach or even exceed the physical limit of photolithography, which may pose a serious challenge to photolithography. The basic concept of a double patterning technique is to form a final target pattern by the double patterning, which may overcome the photolithographic limit for a single patterning technique. However, the existing semiconductor device process may be complicated and have high cost.

SUMMARY

One aspect of the present disclosure provides a method for fabricating a semiconductor device. The method includes providing a layer to be etched; forming a first mask layer on the layer to be etched; forming a first trench and a second trench in the first mask layer, where the first trench and the second trench extend along a first direction; forming a blocking layer over the first mask layer; forming a first dividing layer in the first blocking opening to divide the first trench along the first direction; when forming the first dividing layer, forming second dividing layers on two sidewalls of the second blocking opening and arranged along the first direction, where the second dividing layers divide the second trench along the first direction; after forming the first dividing layer and the second dividing layers, removing the blocking layer. A portion of the blocking layer is formed in a first portion of the first trench and a first portion of the second trench; the blocking layer includes a first blocking opening, formed on and connecting to pass through a second portion of the first trench, and a second blocking opening, formed on and connecting to pass through a second portion of the second trench; the first blocking opening and the second blocking opening are discrete; and a size of the second blocking opening along the first direction is greater than a size of the first blocking opening along the first direction.

Another aspect of the present disclosure includes a semiconductor device fabricated according to the above-mentioned method of the present disclosure. The semiconductor device includes a layer to be etched; a first mask layer on the layer to be etched, where a first trench and a second trench, both extending along a first direction, are formed in the first mask layer, and a mask sidewall spacer is formed on inner walls of each of the first trench and the second trench; a plurality of first dividing layers formed in the first trench that are arranged along the first direction and discrete from each other; and a plurality of second dividing layers formed in the second trench that are arranged along the first direction and discrete from each other. A size of a second dividing layer along the first direction is smaller than a size of the first dividing layer along the first direction; and a density of the plurality of second dividing layers along the first direction is greater than a density of the plurality of first dividing layers along the first direction.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
FIGS. 1-24 illustrate structural schematics corresponding to certain stages for forming an exemplary semiconductor device according to various disclosed embodiments of the present disclosure.

Reference will now be made in detail to exemplary embodiments of the disclosure, which are illustrated in the accompanying drawings. Wherever possible, the same reference numbers will be used throughout the drawings to refer to the same or like parts.

In the existing technology, the method for forming a semiconductor device may include providing a layer to be etched; forming a mask layer on the layer to be etched; forming a first trench and a second trench in the mask layer, where both the first trench and the second trench may extend along a first direction; forming a first dividing layer in the first trench, where the first dividing layer may divide the first trench along the first direction; and forming a second dividing layer in the second trench, where the second dividing layer may divide the second trench along the first direction, and a density of the second dividing layer along the first direction may be greater than a density of the first dividing layer along the first direction.

The density of the second dividing layer along the first direction may be greater than the density of the first dividing layer along the first direction, such that dividing layers with different density arrangements may be formed to meet process requirements.

With the continuous reduction of the feature size of the semiconductor device, a size of the second dividing layer along the first direction and a distance between adjacent second dividing layers may continue to be reduced. Since the density of the second dividing layer along the first direction is relatively large, adjacent second dividing layers along the first direction may not be formed in a same process, and the second dividing layers may be required to be formed in different processing steps respectively, that is, a portion of the second dividing layers may be formed first, and then a remaining portion of the second dividing layers may be formed. Correspondingly, multiple processes may be required to form the first dividing layers and the second dividing layers, which may increase process complexity and cost.

The present disclosure provides a method for forming a semiconductor device. The method may include forming a first trench and a second trench in a first mask layer, where both the first trench and the second trench may extend along a first direction; forming a blocking layer on the first mask layer, where a portion of the blocking layer is formed in a first portion of the first trench and a first portion of the second trench, the blocking layer includes a first blocking opening, formed on and connecting to pass through a second portion of the first trench, and a second blocking opening, formed on and connecting to pass through a second portion of the second trench, and a size of the second blocking opening along the first direction may be greater than a size of the first blocking opening along the first direction; forming a first dividing layer in the first blocking opening to divide the first trench along the first direction, and forming second dividing layers located on two sidewalls of the second blocking opening and arranged along the first direction when forming the first dividing layer, where the second dividing layer may divide the second trench along the first direction; after forming the first dividing layer and the second dividing layer, removing the blocking layer. The process may be simplified, and the cost may be reduced using the above-mentioned method.

In order to further illustrate the above described objects, features, and advantages of the present disclosure, various specific embodiments of the present disclosure will be described in detail below with reference to the accompanying drawings.

FIGS. 1-24 illustrate structural schematics corresponding to certain stages for forming an exemplary semiconductor device according to various disclosed embodiments of the present disclosure. FIG. 25 illustrates a flowchart of an exemplary fabrication method for forming a semiconductor structure according to various disclosed embodiments of the present disclosure.

Referring to FIG. 1, a layer to be etched 100 may be provided (e.g., in S401 of FIG. 25).

The layer to be etched 100 may be made of a material including silicon oxide or a low-k dielectric layer (K may be less than or equal to 3.9).

The layer to be etched 100 may include a plurality of discrete first regions A1 and a plurality of discrete second regions A2. The first regions A1 and the second regions A2 may be alternatingly arranged along a second region X, and a first region A1 and a second region A2 may be adjoined to each other.

The plurality of the first regions A1 may be arranged along the second direction X, and the plurality of the second regions A2 may be arranged along the second direction X.

The alternating arrangement of the first regions A1 and the second regions A2 along the second direction X may indicate that only one second region A2 may be between adjacent first regions A1 and only one first region A1 may be between adjacent second regions A2.

In other embodiments, quantities of the first regions and the second regions may be same.

Figure 2:
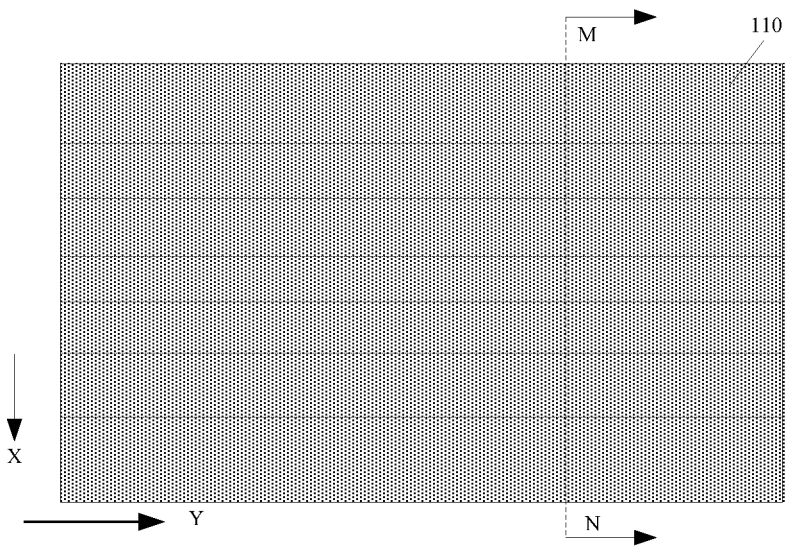
Figure 3:

Referring to FIG. 2 and FIG. 3, FIG. 2 is a schematic for the structure based on FIG. 1, and FIG. 3 is a cross-sectional view along a cross-sectional line M-N in FIG. 2. A first mask layer 110 may be formed on the layer to be etched 100 (e.g., in S402 of FIG. 25).

The first mask layer 110 may be formed on the first regions A1 and the second regions A2 of the layer to be etched 110.

The first mask layer 110 may be made of a material including amorphous silicon, silicon nitride, or silicon oxide.

In one embodiment, the method may further include: before forming the first mask layer 110, forming a first bonding layer (not shown) on the layer to be etched 100; forming a bottom hard mask layer 120 on the first bonding layer; forming a second bonding layer on the bottom hard mask layer 120; and forming the first mask layer 110 on the second bonding layer.

The bottom hard mask layer 120 may be made of a material including titanium nitride.

The first bonding layer may be made of a material including SiOC, and the second bonding layer may be made of a material including SiOC.

The first bonding layer may be used to improve the adhesion between the bottom hard mask layer 120 and the layer to be etched 100, such that the bonding between the bottom hard mask layer 120 and the layer to be etched 100 may be more robust. The second bonding layer may be used to improve the adhesion between the first mask layer 110 and the bottom hard mask layer 120, such that the bonding between the first mask layer 110 and the bottom hard mask layer 120 may be more robust.

The function of the bottom hard mask layer 120 may include the following. The bottom hard mask layer 120 may be used as an etch stop layer; the bottom hard mask layer 120 may be used as a stop layer for planarizing a conductive film subsequently; and the material of the bottom hard mask layer 120 may be used as a hard mask material. Therefore, when forming a first target trench and a second target trench by a subsequent etching process, the etching loss of the bottom hard mask layer 120 may be relatively small, and the stability of pattern transfer may be relatively high when transferring a pattern in the bottom hard mask layer 120 to the layer to be etched 100.

In one embodiment, materials of the bottom hard mask layer 120 and the first mask layer 110 may be different.

In other embodiments, the bottom hard mask layer, the first bonding layer and the second bonding layer may not be formed.

Figure 4:
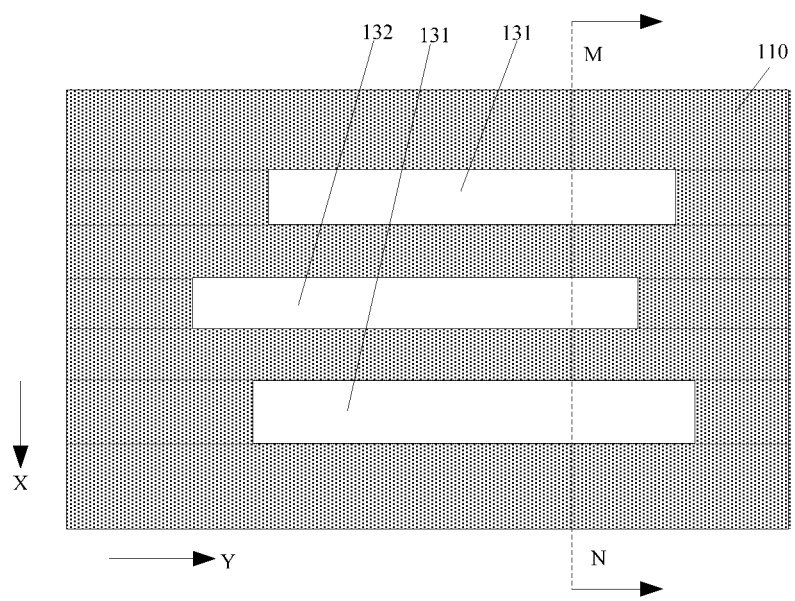
Figure 5:
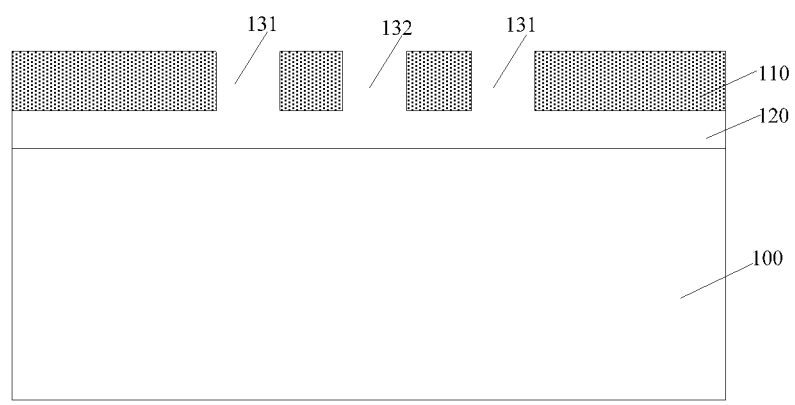

Referring to FIG. 4 and FIG. 5, FIG. 4 is a schematic for the structure based on FIG. 2, and FIG. 5, based on FIG. 3, is a cross-sectional view along a cross-sectional line M-N in FIG. 4. A first trench 131 and a second trench 132 may be formed in the first mask layer 110 (e.g., in S403 of FIG. 25). Both the first trench 131 and the second trench 132 may extend along a first direction Y.

Both the first trench 131 and the second trench 132 may be on the first regions A1, and the second direction X may be perpendicular to the first direction Y.

In one embodiment, the first trench 131 and the second trench 132 may be discrete as an example. The first trench 131 and the second trench 132 may be on different first regions A1. In one embodiment, for adjacent first regions A1, the first trench 131 may be on one first region A1, and the second trench 132 may be on the other first region A1.

Figure 6A:
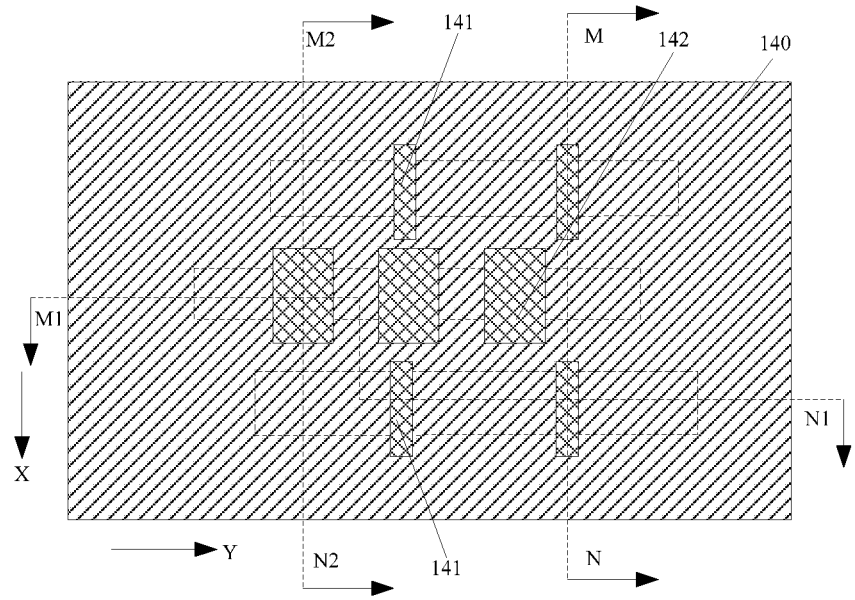
Figure 6B:
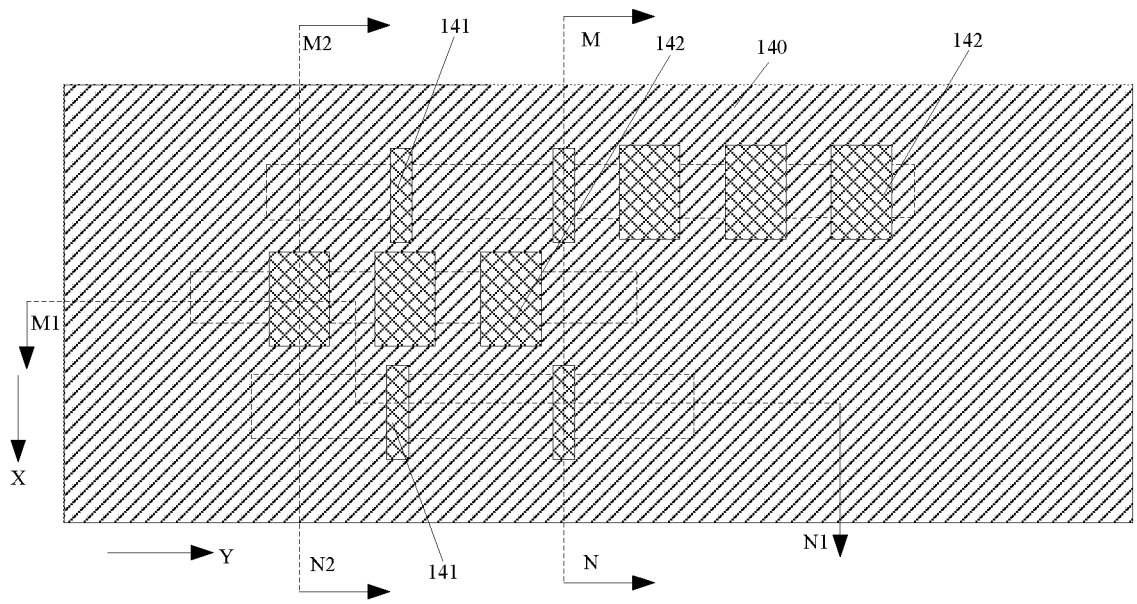

In other embodiments, one first trench and one second trench may form one first trench group, as shown in FIG. 6b.

A plurality of the first trench groups may be formed in the first mask layer of the first regions. For a same first trench group, the first trench and the second trench may be connected to pass through each other along the first direction.

The first trench 131 and the second trench 132 may be formed by a dry etching process including an anisotropic dry etching process.

The first trench 131 and the second trench 132 may be formed in a same etching process.

A width of the first trench 131 along the second direction X may be about 10 nm to about 60 nm. A width of the second trench 132 along the second direction X may be about 10 nm to about 60 nm.

In one embodiment, the method may further include: forming mask sidewall spacers on sidewalls of the first trench 131 and sidewalls of the second trench 132; forming a blocking layer on the first mask layer 110, where a portion of the blocking layer 110 may be formed in a first portion of the first trench 131 and a first portion of the second trench 132, the blocking layer may include a first blocking opening, formed on and connecting to pass through a second portion of the first trench 131, and a second blocking opening, formed on and connecting to pass through a second portion of the second trench 132, the first blocking opening and the second blocking opening may be discrete, and a size of the second blocking opening along the first direction Y may be greater than a size of the first blocking opening along the first direction Y; forming a first dividing layer in the first blocking opening to divide the first trench along the first direction, and forming second dividing layers located on sidewalls of the second blocking opening and arranged along the first direction when forming the first dividing layer, where the second dividing layers may divide the second trench along the first direction; after forming the first dividing layer and the second dividing layer, removing the blocking layer.

In one embodiment, when forming the mask sidewall spacers, the first dividing layer and the second dividing layer may be formed. In other embodiments, after forming the mask sidewall spacers, the blocking layer may be formed, or after removing the blocking layer, the mask sidewall spacers may be formed.

Figure 7:
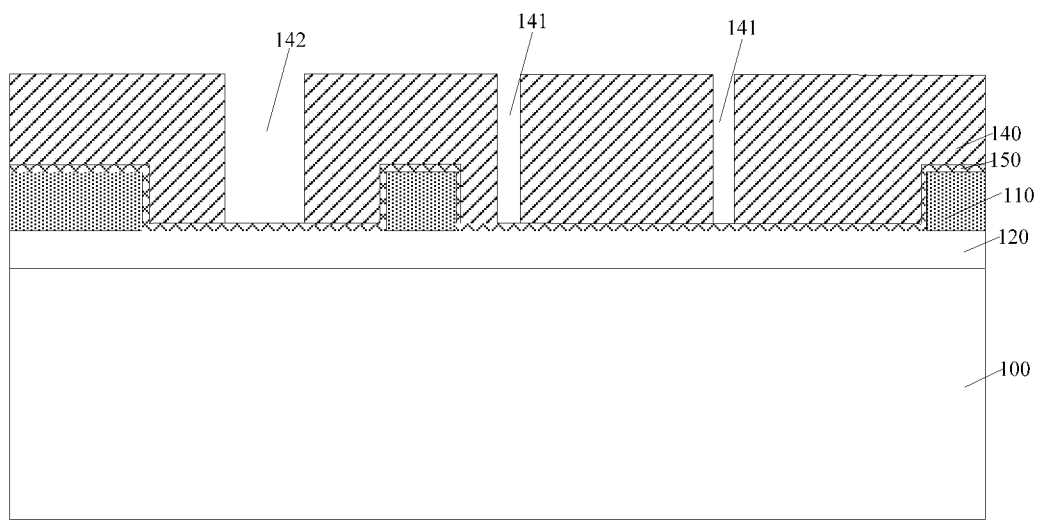
Figure 8:
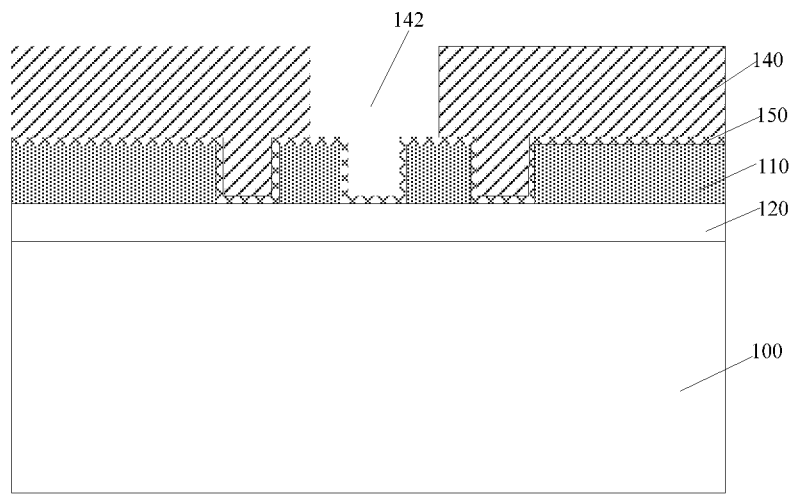
Figure 9:
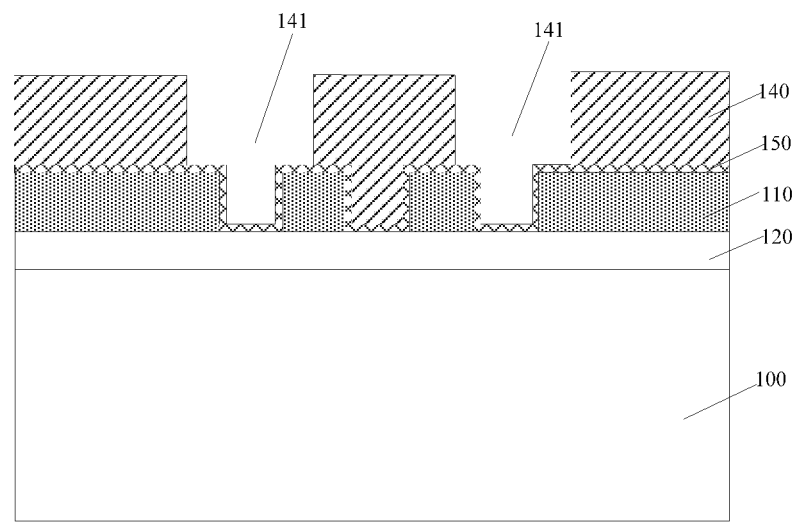

Referring to FIGS. 6-9, FIG. 6a is a schematic for the structure based on FIG. 4, FIG. 7 is a cross-sectional view along a cross-sectional line M1-N1 in FIG. 6a, FIG. 8 is a cross-sectional view along a cross-sectional line M2-N2 in FIG. 6a, and FIG. 9 is a cross-sectional view along a cross-sectional line M-N in FIG. 6a. A sidewall spacer film 150 may be formed on sidewalls and a bottom of the first trench 131, on sidewalls and a bottom of the second trench 132, and on a top surface of the first mask layer 110. After forming the sidewall spacer film 150, a blocking layer 140 may be formed on the first mask layer 110, where a portion of the blocking layer 140 is formed in a first portion of the first trench 131 and a first portion of the second trench 132. The blocking layer 140 may include a first blocking opening 141, formed on and connecting to pass through a second portion of the first trench 131, and a second blocking opening 142, formed on and connecting to pass through a second portion of the second trench 132 (e.g., in S404 of FIG. 25). The first blocking opening 141 and the second blocking opening 142 may be discrete. A size of the second blocking opening 142 along the first direction Y may be larger than a size of the first blocking opening 141 along the first direction Y.

The sidewall spacer film 150 may be made of a material including $SiO_2$, SiN, $TiO_2$, TiN, AlN or $Al_2O_3$. Materials of the sidewall spacer film 150, the first mask layer 110 and the blocking layer may be different from each other.

The sidewall spacer film 150 may be formed by a deposition process, such as an atomic layer deposition process.

A thickness of the sidewall spacer film 150 may be about 10 nm to about 30 nm, such as 10 nm, 15 nm, 20 nm, or 30 nm.

The sidewall spacer film 150 may be used to form the mask sidewall spacers.

In one embodiment, the blocking layer 140 may be on the sidewall spacer film 150. A bottom of the first blocking opening 141 may expose the sidewall spacer film 150, and a bottom of the second blocking opening 142 may expose the sidewall spacer film 150.

The blocking layer 140 may be made of a material including a carbon-containing organic polymer.

The first blocking opening 141 may extend along the second direction X on the first mask layer 110 on two sides of the first trench 131, and the second blocking opening 142 may extend along the second direction X on the first mask layer 110 on two sides of the second trench 132, where the second direction X may be perpendicular to the first direction Y.

A size of the first blocking opening 141 along the first direction Y may be used to define a size of a subsequent first dividing layer along the first direction Y. Since the size of the first dividing layer along the first direction Y is required to be relatively small, a width of the first blocking opening 141 along the first direction Y may be relatively small. For example, in one embodiment, the width of the first blocking opening 141 along the first direction Y may be about 20 nm to about 60 nm, such as 20 nm, 30 nm, 40 nm, 50 nm, or 60 nm.

The first blocking opening 141 may also extend along the second direction X on the first mask layer 110 on two sides of the first trench 131, such that the size of the first blocking opening 141 along the second direction X may be relatively large. In such way, only the size of the first blocking opening 141 along the first direction Y may be defined to be relatively small, and the size of the first blocking opening 141 along the second direction X may not be defined to be relatively small, which may reduce the challenge to the photolithography process and the process difficulty. In one embodiment, the size of the first blocking opening 141 along the second direction X may be about 65 nm to about 1000 nm, such as 80 nm, 90 nm, 100 nm, 150 nm, or 200 nm.

The second blocking opening 142 may also extend along the second direction X on the first mask layer 110 on two sides of the second trench 132, such that the size of the second blocking opening 142 along the second direction X may be relatively large. The size of the second blocking opening 142 along the first direction Y may be greater than the size of the first blocking opening 141 along the first direction Y, and the size of the second blocking opening 142 along the first direction Y may also be relatively large, such that the photolithographic process difficulty for forming the second blocking opening 142 may be relatively low. In one embodiment, the size of the second blocking opening 142 along the second direction X may be about 65 nm to about 1000 nm, such as 80 nm, 90 nm, 100 nm, 150 nm, or 200 nm; and the size of the second blocking opening 142 along the first direction Y may be about 30 nm to about 200 nm.

Subsequently, the first dividing layer may be formed in the first blocking opening 141 to divide the first trench 131 along the first direction Y. When forming the first dividing layer, the second dividing layers may be formed on two sidewalls of the second blocking opening 142 and arranged along the first direction Y, where the second dividing layers may divide the second trench 132 along the first direction Y.

The method for forming the first dividing layer and the second dividing layer may include: forming a dividing film in the first blocking opening 141, on sidewalls and a bottom of the second blocking opening 142, and on the blocking layer 140; and etching back the dividing film to remove the dividing film on the top surface of the blocking layer 140, over the first mask layer 110 at the bottom of the first blocking opening 141, over the first mask layer 110 at the bottom of the second blocking opening 142, and at the bottom of the second trench, thereby forming the first dividing layer and the second dividing layer.

Figure 10:
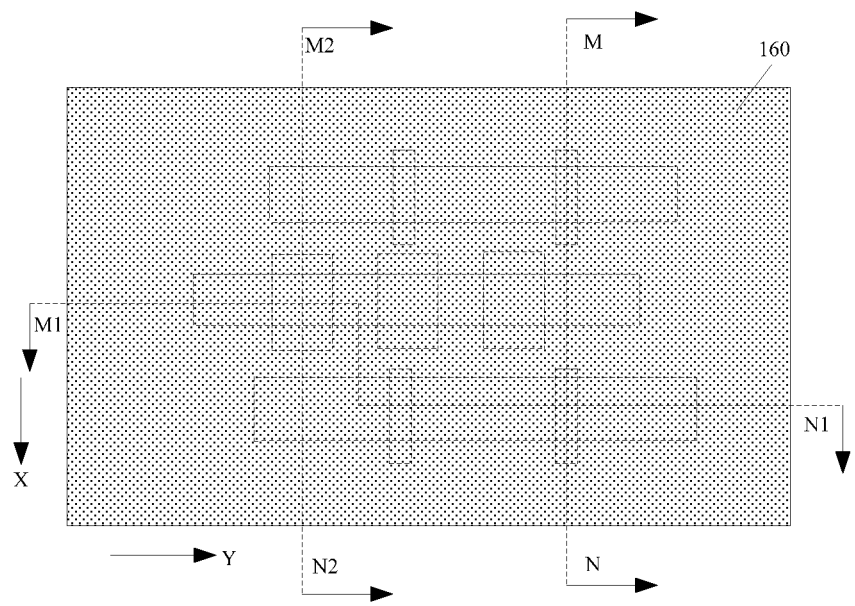
Figure 11:
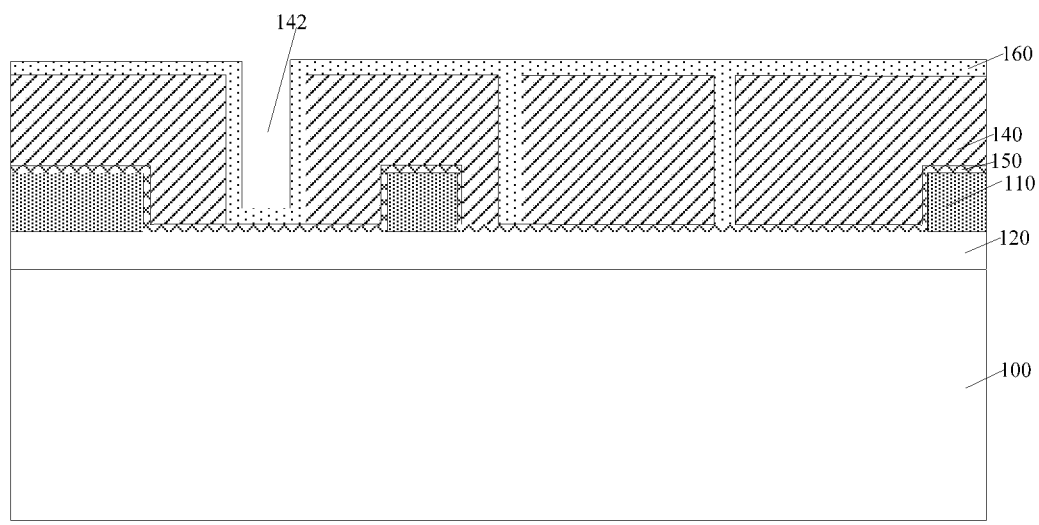
Figure 12:
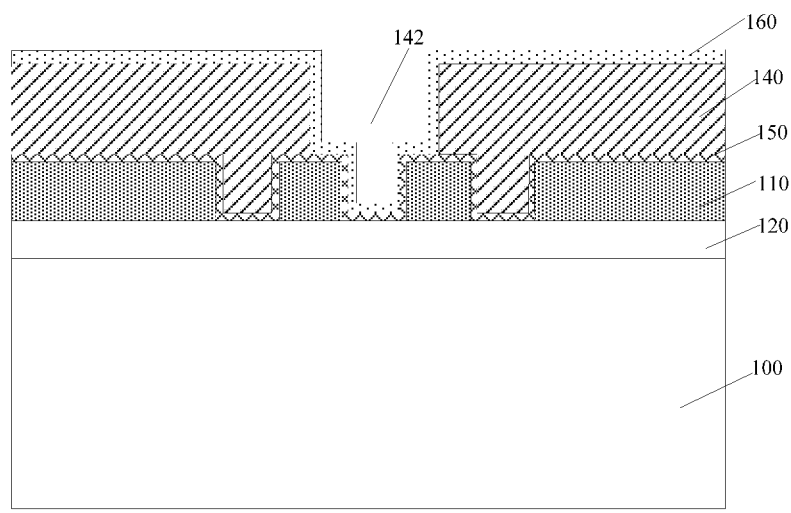
Figure 13:
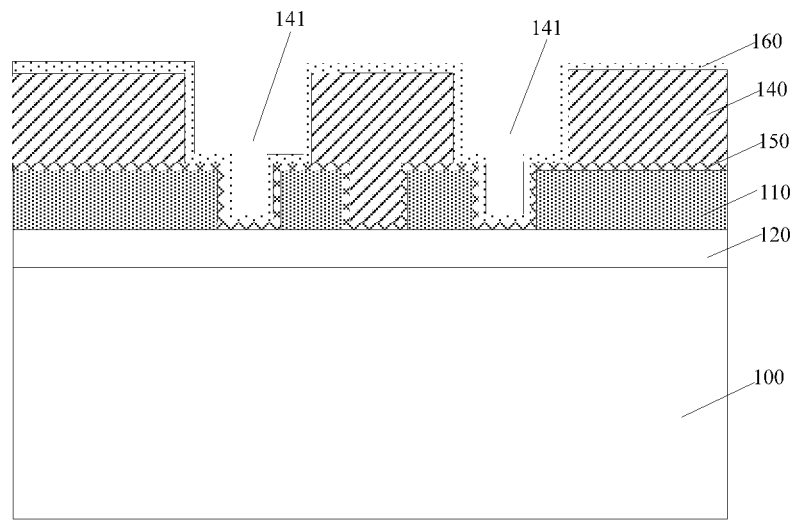

Referring to FIGS. 10-13, FIG. 10 is a schematic for the structure based on FIG. 6a, FIG. 11 is a cross-sectional view along a cross-sectional line M1-N1 in FIG. 10, FIG. 12 is a cross-sectional view along a cross-sectional line M2-N2 in FIG. 10, FIG. 13 is a cross-sectional view along a cross-sectional line M-N in FIG. 10, FIG. 11 is a schematic for the structure based on FIG. 7, FIG. 12 is a schematic for the structure based on FIG. 8, and FIG. 13 is a schematic for the structure based on FIG. 9. A dividing film 160 may be formed in the first blocking opening 141, on the sidewalls and bottom of the second blocking opening 142, and on the blocking layer 140.

The first blocking opening 141 may be completely filled with the dividing film 160. The dividing film 160 may be on the sidewalls and bottom of the second blocking opening 142. Two times of the thickness of the dividing film 160 in the second blocking opening 142 may be less than the size of the second blocking opening 142 along the first direction.

In one embodiment, the dividing film 160 may be also on the sidewall spacer film 150.

The dividing film 160 may be formed by a deposition process.

The dividing film 160 may be made of a material including $SiO_2$, SiN, $TiO_2$, TiN, AlN or $Al_2O_3$.

The materials of the dividing film 160, the sidewall spacer film 150 and the blocking layers may be different from each other.

Figure 14:
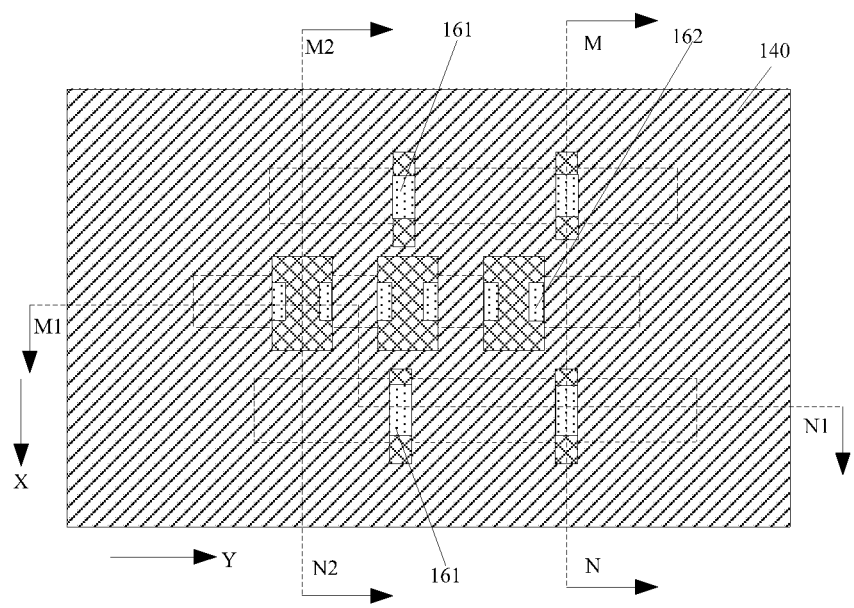
Figure 15:
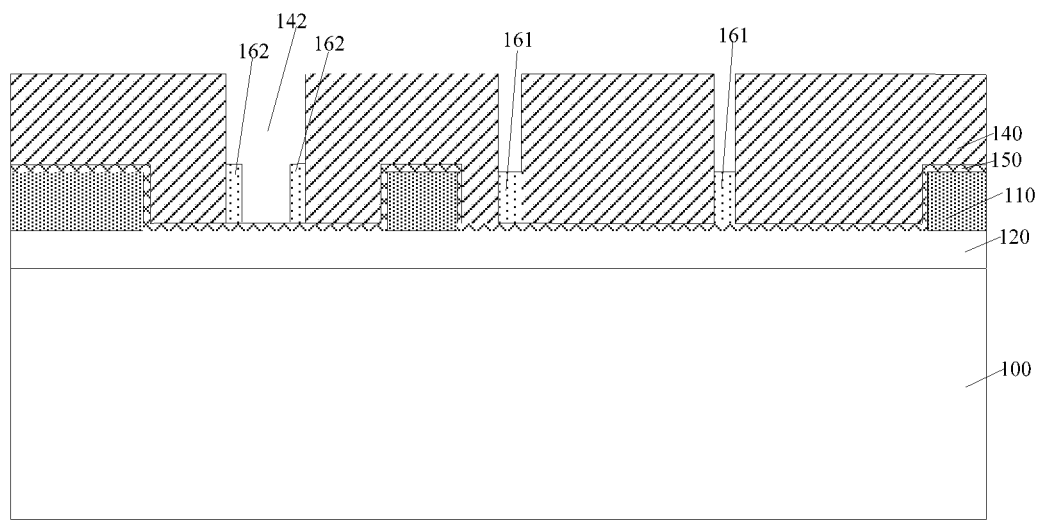
Figure 16:
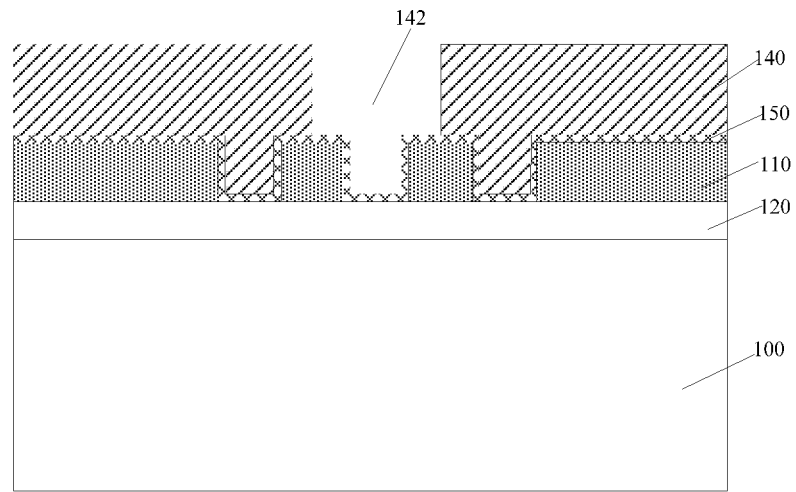
Figure 17:
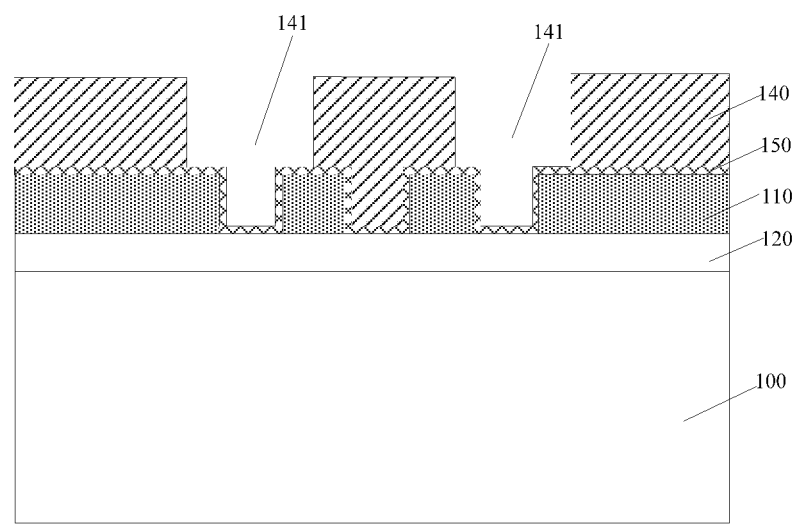

Referring to FIGS. 14-17, FIG. 14 is a schematic for the structure based on FIG. 10, FIG. 15 is a cross-sectional view along a cross-sectional line M1-N1 in FIG. 14, FIG. 16 is a cross-sectional view along a cross-sectional line M2-N2 in FIG. 14, FIG. 17 is a cross-sectional view along a cross-sectional line M-N in FIG. 14, FIG. 15 is a schematic for the structure based on FIG. 11, FIG. 16 is a schematic for the structure based on FIG. 12, and FIG. 17 is a schematic for the structure based on FIG. 13. The dividing film 160 may be etched back to remove the dividing film 160 on the top surface of the blocking layer 140, over the first mask layer 110 at the bottom of the first blocking opening 141, over the first mask layer 110 at the bottom of the second blocking opening 142, and at the bottom of the second trench, thereby forming a first dividing layer 161 and a second dividing layer 162 (e.g., in S405 and S406 of FIG. 25).

The first dividing layer 161 may be in the first blocking opening 141 to divide the first trench 131 along the first direction Y. The second dividing layers 162 may be located on two sidewalls of the second blocking opening 142 and arranged along the first direction Y, and the second dividing layer 162 may divide the second trench 132 along the first direction Y.

In one embodiment, the thickness of the blocking layer 140 on the first mask layer 110 may be greater than the thickness of the first mask layer 110, and the process for etching back the dividing film 160 may be used to remove the dividing film 160 located on two sidewalls of the first trench 131 and arranged along the second direction X, and the dividing film 160 located on two sidewalls of the second trench 132 and arranged along the second direction X, thereby increasing a size of a subsequent second sub-target trench along the second direction X and increasing a size of a second sub-conductive layer along the second direction X. The thickness of the blocking layer 140 may refer to a size of the blocking layer 140 along a direction perpendicular to a surface of the layer to be etched. The thickness of the first mask layer 110 may refer to a size of the first mask layer 110 along the direction perpendicular to the surface of the layer to be etched.

In other embodiments, the process for etching back the dividing film 160 may retain the dividing film 160 on sidewalls of the first trench 131 and arranged along the second direction X, and also retain the dividing film 160 on sidewalls of the second trench 132 and arranged along the second direction X.

In one embodiment, when etching back the dividing film 160, the etching loss of the sidewall spacer film may be relatively small, and the sidewall spacer film may protect the material layer at the bottom of the sidewall spacer film. On the one hand, the sidewall spacer film may protect the first mask layer on two sides of the first trench and arranged along the second direction and on two sides of the second trench and arranged along the second direction, thereby avoiding etching the first mask layer by the process of etching back the dividing film 160. On the other hand, the sidewall spacer film may protect the material layer on the bottom of the first trench and on the bottom of the second trench, thereby avoiding etching the material layer on the bottom of the first trench and on the bottom of the second trench by the process of etching back the dividing film 160. Next, the sidewall spacer film may be used as the stop layer for etching back the dividing film 160, such that a relatively large etching selectivity between the dividing film 160 and the sidewall spacer film may be required to be considered for the process of etching back the dividing film 160; however, a relatively large etching selectivity between the dividing film 160 and the first mask layer may not be required to be considered, thereby reducing the process difficulty of etching back the dividing film 160.

In one embodiment, the first trench 131 and the second trench 132 may be discrete. A quantity of the first dividing layers 161 in each first trench 131 may be one or more. When the quantity of the first dividing layers 161 in each first trench 131 is more than one, a distance between adjacent first dividing layers 161 along the first direction Y may be larger than a distance between adjacent second dividing layers 162 along the first direction Y. In such way, a density of the second dividing layers 162 along the first direction Y may be greater than a density of the first dividing layers 161 along the first direction Y, thereby satisfying the process requirements.

When the first trench and the second trench are connected to pass through each other along the first direction Y, in one embodiment, the quantity of the first dividing layers in each first trench may be one, and the distance between a first dividing layer and a second dividing layer adjacent to the first dividing layer along the first direction may be greater than the distance between adjacent second dividing layers along the first direction. In another embodiment, the quantity of the first dividing layers in each first trench may be more than one, and the quantity of the second dividing layers in each second trench may be more than one; the distance between adjacent first dividing layers along the first direction may be greater than the distance between adjacent second dividing layers along the first direction, and the distance between the first dividing layer and the second dividing layer adjacent to the first dividing layer along the first direction may be greater than the distance between adjacent second dividing layers along the first direction.

An overlapped region of the first blocking opening 141 and the first trench 161 may be used to define a position of the first dividing layer 161, such that the size of the first dividing layer 161 along the second direction X may be relatively small. The width of the first blocking opening 141 along the first direction may be used to define the size of the first dividing layer 161 along the first direction, such that the size of the first dividing layer 161 along the first direction may also be relatively small when the width of the first blocking opening 141 along the first direction is relatively small.

In one embodiment, the first dividing layer 161 may not extend to the second region A2.

The second dividing layers 162 are on two sidewalls of the second blocking opening 142 and arranged along the first direction, such that the size of the second dividing layer 162 along the first direction may be defined by the thickness of the dividing film. When the thickness of the dividing film is relatively small, the size of the second dividing layer 162 along the first direction may be relatively small.

In one embodiment, the size of the first dividing layer 161 along the first direction Y may be about 10 nm to about 40 nm; and the size of the second dividing layer 162 along the first direction Y may be about 10 nm to about 40 nm.

Figure 18:
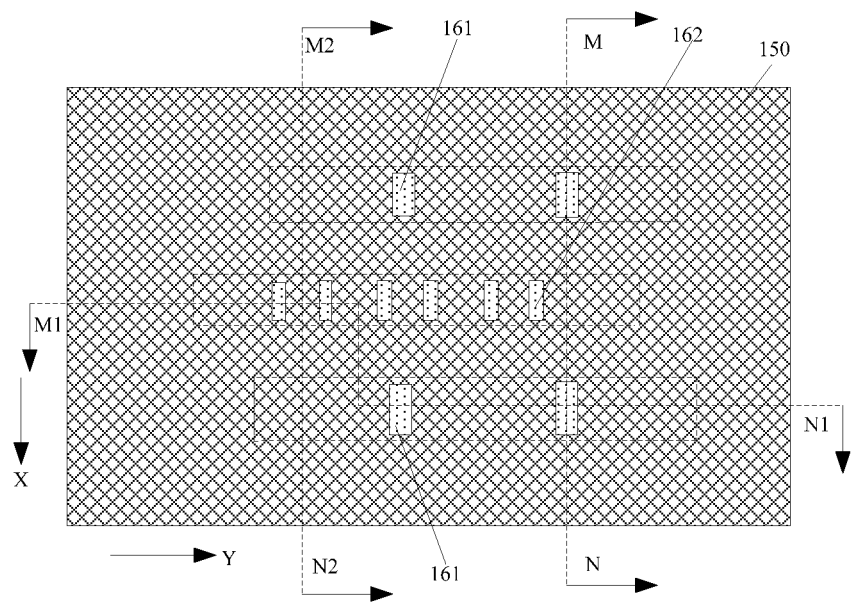
Figure 19:
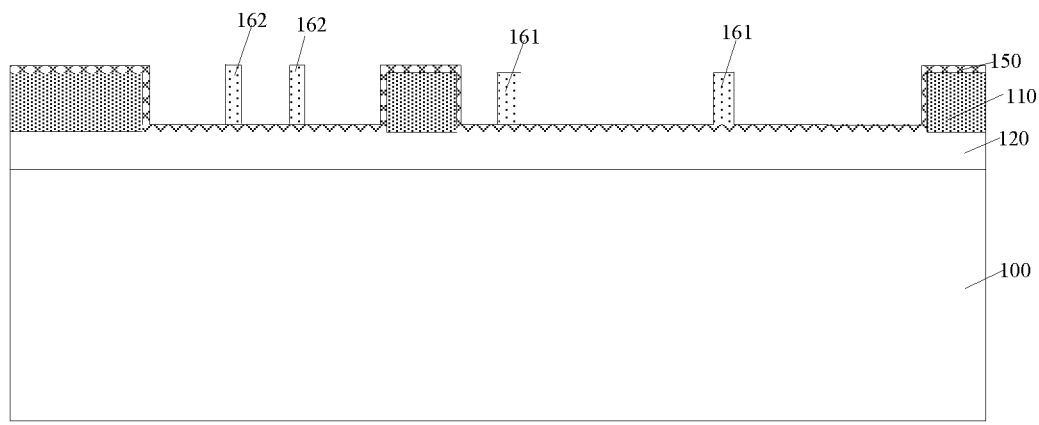
Figure 20:
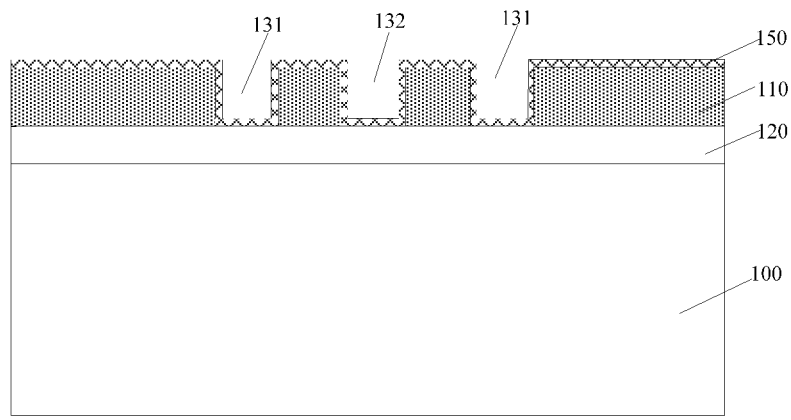

Referring to FIGS. 18-20, FIG. 18 is a schematic for the structure based on FIG. 14, FIG. 19 is a cross-sectional view along a cross-sectional line M1-N1 in FIG. 18, FIG. 20 is a cross-sectional view along a cross-sectional line M2-N2 in FIG. 18, FIG. 19 is a schematic for the structure based on FIG. 15, and FIG. 20 is a schematic for the structure based on FIG. 16. After forming the first dividing layer 161 and the second dividing layer 162, the blocking layer 140 may be removed (e.g., in S407 of FIG. 25).

The blocking layer 140 may be removed by a dry etching process or a wet etching process.

Figure 21:
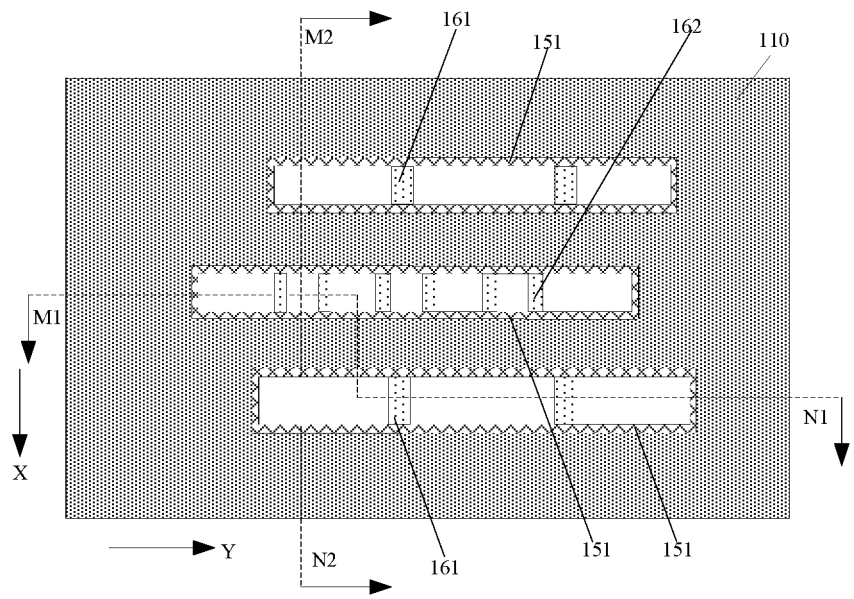
Figure 22:
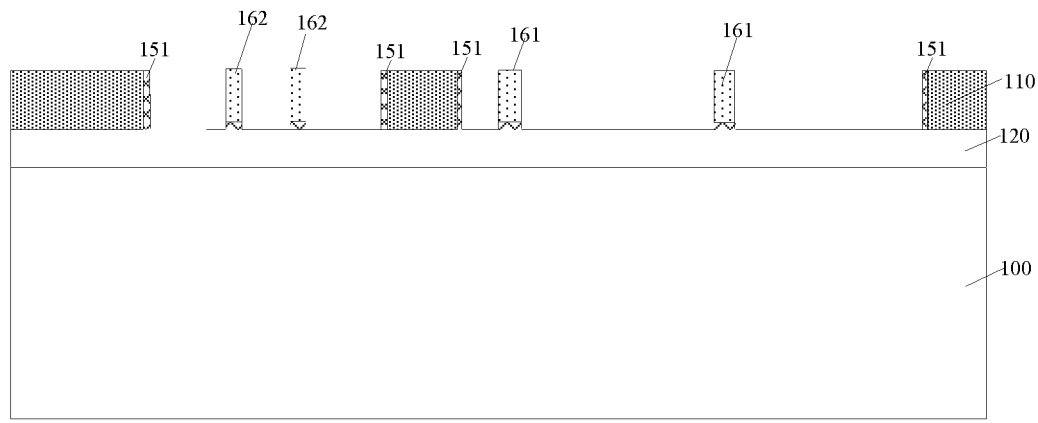
Figure 23:
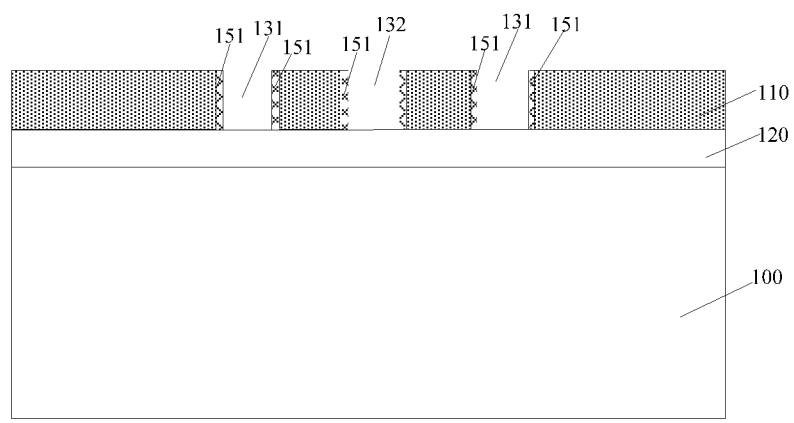

Referring to FIGS. 21-23, FIG. 21 is a schematic for the structure based on FIG. 18, FIG. 22 is a cross-sectional view along a cross-sectional line M1-N1 in FIG. 21, FIG. 23 is a cross-sectional view along a cross-sectional line M2-N2 in FIG. 21, FIG. 22 is a schematic for the structure based on FIG. 19, and FIG. 23 is a schematic for the structure based on FIG. 20. The sidewall spacer film 150 may be etched back till exposing the top surface of the first mask layer 110 to form mask sidewall spacers 151.

Etching back the sidewall spacer film 150 may also remove the sidewall spacer film 150 at the bottom of the first trench and the bottom of the second trench.

In one embodiment, the mask sidewall spacers 151 may not be on the two sidewalls of the first dividing layer 161 which are arranged along the first direction Y, such that the distance between two sidewalls of the first dividing layer 161 which are arranged along the first direction Y in the first trench 131 may be the size of the first dividing layer 161 along the first direction Y, and the distance between two sidewalls of the first dividing layer 161 which are arranged along the first direction Y in the first trench 131 may be relatively small. The mask sidewall spacers 151 may not be on the two sidewalls of the second dividing layer 162 which are arranged along the first direction Y, such that the distance between two sidewalls of the second dividing layer 162 which arranged along the first direction Y in the second trench 132 may be the size of the second dividing layer 162 along the first direction Y, and the distance between two sidewalls of the second dividing layer 162 which are arranged along the first direction Y may be relatively small.

In one embodiment, when forming the mask sidewall spacers 151, the first dividing layer 161 and the second dividing layer 162 may be formed. Therefore, the material of the mask sidewall spacers 151 may be also at the bottom of the first dividing layer 161, and the material of the mask sidewall spacers 151 may be also at the bottom of the second dividing layer 162; the mask sidewall spacers 151 may be also on two sidewalls of the first dividing layer 161 and arranged along the second direction, and also on two sidewalls of the second dividing layer 162 and arranged along the second direction.

In one embodiment, the mask sidewall spacers 151 may have a thickness of about 10 nm to about 30 nm.

In one embodiment, the first dividing layer 161 may be made of a material including $SiO_2$, SiN, $TiO_2$, TiN, AlN or $Al_2O_3$, the second dividing layer 162 may be made of a material including $SiO_2$, SiN, $TiO_2$, TiN, AlN or $Al_2O_3$, and the mask sidewall spacer 151 may be made of a material including $SiO_2$, SiN, $TiO_2$, TiN, AlN or $Al_2O_3$. In one embodiment, the materials of the mask sidewall spacer 151 and the first dividing layer 161 may be different, the materials of the mask sidewall spacer 151 and the second dividing layer 162 may be different, and the materials of the first dividing layer 161 and the second dividing layer 162 may be same.

In other embodiments, the blocking layer may be formed after forming the mask sidewall spacers. In such case, the mask sidewall spacers may be on sidewalls of the first trench and the second trench, the material of the mask sidewall spacers may not be at the bottom of the first dividing layer and the bottom of the second dividing layer, the mask sidewall spacers may also not be on two sidewalls of the first dividing layer and arranged along the first direction and also not be on two sidewalls of the second dividing layer and arranged along the first direction; and the mask sidewall spacers may be on two sidewalls of the first dividing layer and arranged along the second direction and also on two sidewalls of the second dividing layer and arranged along the second direction. The materials of the first dividing layer and the mask sidewall spacer may be same or different, the materials of the second dividing layer and the mask sidewall spacer may be same or different, and the materials of the first dividing layer and the second dividing layer may be same.

In other embodiments, the mask sidewall spacers may be formed after forming the blocking layer. In such case, the mask sidewall spacers may be on sidewalls of the first trench and the second trench, on two sidewalls of the first dividing layer and arranged along the first direction, and also on two sidewalls of the second dividing layer and arranged along the first direction; the material of the mask sidewall spacers may not be at the bottom of the first dividing layer and the bottom of the second dividing layer, and the mask sidewall spacers may not be on two sidewalls of the first dividing layer and arranged along the second direction and also not be on two sidewalls of the second dividing layer and arranged along the second direction. The materials of the first dividing layer and the mask sidewall spacer may be same or different, the materials of the second dividing layer and the mask sidewall spacer may be same or different, and the materials of the first dividing layer and the second dividing layer may be same.

Figure 24:
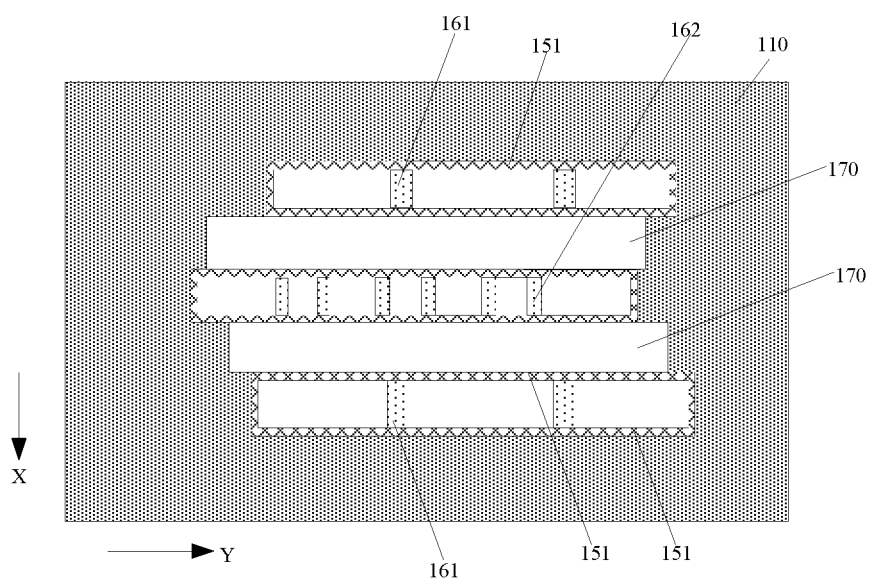
Figure 25:
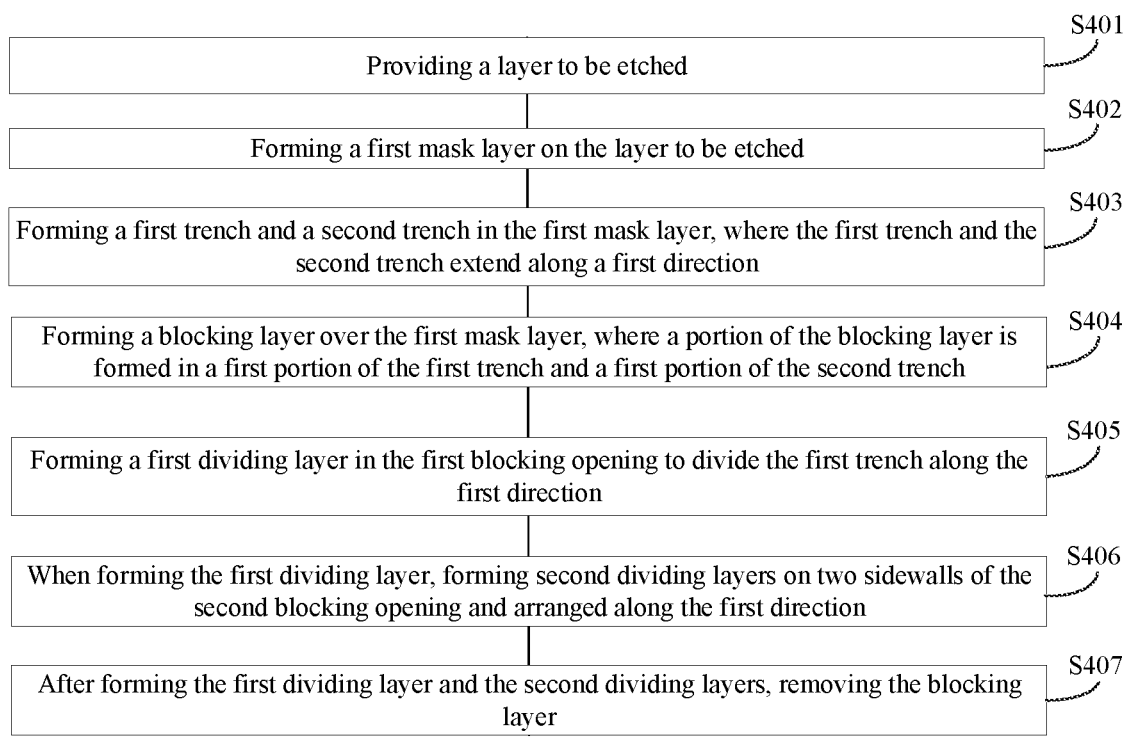
FIG. 25 illustrates a flowchart of an exemplary fabrication method for forming a semiconductor structure according to various disclosed embodiments of the present disclosure.

Referring to FIG. 24, FIG. 24 is a schematic for the structure based on FIG. 21. After forming the mask sidewall spacers 151 and removing the blocking layer 140, a third trench 170 may be formed in the first mask layer 110 of the second region A2, and a sidewall of the third trench 170 may expose a corresponding mask sidewall spacer 151.

In one embodiment, the method may further include: etching the layer to be etched at the bottoms of the first trench and the second trench to form first type target trenches in the layer to be etched; etching the layer to be etched at the bottoms of the third trenches to form second type target trenches in the layer to be etched; forming a first conductive layer in the first type target trenches; and forming a second conductive layer in the second type target trenches.

For example, the first type target trenches may include a first sub-target trench and a second sub-target trench. The layer to be etched at the bottom of the first trench may be etched to form the first sub-target trench in the layer to be etched, and the layer to be etched at the bottom of the second trench may be etched to form the second sub-target trench in the layer to be etched. The first conductive layer may include a first sub-conductive layer and a second sub-conductive layer. The first sub-conductive layer may be in the first sub-target trench and the second sub-conductive layer may be in the second sub-target trench.

In one embodiment, the second type target trench may be formed when forming the first type target trench, which may simplify the process.

In one embodiment, the method may further include: before etching the layer to be etched at the bottoms of the first trench, the second trench and the third trench, etching the second bonding layer, the bottom hard mask layer 120 and the first bonding layer at the bottoms of the first trench and the second trench, thereby forming first hard mask trenches in the bottom hard mask layer 120 at the bottoms of the first trench and the second trench; and etching the second bonding layer, the bottom hard mask layer 120 and the first bonding layer at the bottoms of the third trench, thereby forming second hard mask trenches in the bottom hard mask layer 120 at the bottoms of the third trenches.

In one embodiment, after etching the second bonding layer, the bottom hard mask layer and the first bonding layer at the bottoms of the first trench, the second trench and the third trench, and before forming the first conductive layer and the second conductive layer, the first mask layer and the second bonding layer may be removed; after removing the first mask layer and the second bonding layer, the layer to be etched at the bottom of the first hard mask trench may be etched to form the first type target trench in the layer to be etched, and the layer to be etched at the bottom of the second hard mask trench may be etched to form the second type target trench in the layer to be etched; after forming the first type target trench and the second type target trench, the conductive film may be formed in the first type target trench and the second type target trench, and on the bottom hard mask layer; the conductive film may be planarized till exposing the top surface of the bottom hard mask layer, thereby forming the first conductive layer in the first type target trench and forming the second conductive layer in the second type target trench; and the bottom hard mask layer and the first bonding layer may be removed subsequently.

The first conductive layer and the second conductive layer may be made of a metal including copper or aluminum.

Accordingly, a semiconductor device formed by the above-mentioned method may be provided in one embodiment. The semiconductor device includes a layer to be etched; a first mask layer on the layer to be etched, where a first trench and a second trench, both extending along a first direction, are formed in the first mask layer, and a mask sidewall spacer is formed on inner walls of each of the first trench and the second trench; a plurality of first dividing layers formed in the first trench that are arranged along the first direction and discrete from each other; and a plurality of second dividing layers formed in the second trench that are arranged along the first direction and discrete from each other. A size of a second dividing layer along the first direction is smaller than a size of the first dividing layer along the first direction. A density of the plurality of second dividing layers along the first direction is greater than a density of the plurality of first dividing layers along the first direction. A distance between adjacent first dividing layers along the first direction is greater than a distance between adjacent second dividing layers along the first direction.

From the above-mentioned embodiments, it can be seen that the technical solution provided by the present disclosure may achieve at least the following beneficial effects.

In the fabrication method of the semiconductor device provided by the technical solution of the present disclosure, the second dividing layer may be formed when forming the first dividing layer in the first blocking opening; the second dividing layers may be on two sidewalls of the second blocking opening and arranged along the first direction; the first dividing layer may divide the first trench along the first direction; and the second dividing layer may divide the second trench along the first direction. Therefore, the density of the second dividing layers along the first direction may be greater than the density of the first dividing layers along the first direction, such that the dividing layers with different densities may be formed to satisfy the process requirement.

The overlapped region of the first blocking opening and the first trench may be used to define the position of the first dividing layer. Since the density of the first dividing layers along the first direction is relatively small, the density of the first blocking openings along the first direction may be relatively small and the photolithographic process difficulty of the first blocking openings may be relatively small. Since the size of the second blocking opening along the first direction is larger than the size of the first blocking opening along the first direction, the photolithographic process difficulty of the second blocking openings may also be relatively small. The first blocking opening and the second blocking opening may be formed in a same photolithographic process which may reduce the number of masks, and the second dividing layer may be formed when forming the first dividing layer, thereby simplifying the process and reducing the cost.

Although the present disclosure has been disclosed above, the present disclosure is not limited thereto. Any changes and modifications may be made by those skilled in the art without departing from the spirit and scope of the disclosure, and the scope of the disclosure should be determined by the scope defined by the appended claims.

What is claimed is:

1. A fabrication method of a semiconductor device, comprising:
providing a layer to be etched;
forming a first mask layer on the layer to be etched;
forming a first trench and a second trench in the first mask layer, wherein the first trench and the second trench extend along a first direction;
forming a blocking layer over the first mask layer, wherein a portion of the blocking layer is formed in a first portion of the first trench and a first portion of the second trench, wherein:
the blocking layer includes a first blocking opening, formed on and connecting to pass through a second portion of the first trench, and a second blocking opening, formed on and connecting to pass through a second portion of the second trench;

the first blocking opening and the second blocking opening are discrete; and a size of the second blocking opening along the first direction is greater than a size of the first blocking opening along the first direction;

forming a first dividing layer in the first blocking opening to divide the first trench along the first direction;

when forming the first dividing layer, forming second dividing layers on two sidewalls of the second blocking opening and arranged along the first direction, wherein the second dividing layers divide the second trench along the first direction;

after forming the first dividing layer and the second dividing layers, removing the blocking layer.

2. The method according to claim 1, wherein:
the first mask layer is made of a material including amorphous silicon, silicon nitride or silicon oxide, and
the blocking layer is made of a material including a carbon-containing organic polymer.

3. The method according to claim 1, wherein:
the first blocking opening further extends along a second direction onto the first mask layer on both sides of the first trench;
the second blocking opening further extends along the second direction onto the first mask layer on both sides of the second trench; and
the second direction is perpendicular to the first direction.

4. The method according to claim 3, wherein forming the first dividing layer and the second dividing layers includes:
forming a dividing film in the first blocking opening, on sidewalls and a bottom of the second blocking opening and on the blocking layer; and
etching back the dividing film to remove the dividing film on a top surface of the blocking layer, over the first mask layer at a bottom of the first blocking opening, over the first mask layer at the bottom of the second blocking opening, and at a bottom of the second trench, thereby forming the first dividing layer and the second dividing layer.

5. The method according to claim 4, wherein:
a process for etching back the dividing film further removes the dividing film located on two sidewalls of the first trench and arranged along the second direction, and the dividing film located on two sidewalls of the second trench and arranged along the second direction.

6. The method according to claim 1, wherein:
a thickness of the blocking layer on the first mask layer is greater than a thickness of the first mask layer.

7. The method according to claim 1, wherein:
a size of the first dividing layer along the first direction is about 10 nm to about 40 nm, and a size of the second dividing layer along the first direction is about 10 nm to about 40 nm.

8. The method according to claim 1, wherein:
one first trench and one second trench form one first trench group;
the first mask layer includes a plurality of first trench groups;
in a same first trench group, the first trench and the second trench are connected to pass through each other along the first direction.

9. The method according to claim 8, wherein:
a quantity of the first dividing layers in each first trench is one, and a distance between a first dividing layer and a second dividing layer adjacent to the first dividing layer along the first direction is greater than a distance between adjacent second dividing layers along the first direction.

10. The method according to claim 8, wherein:
a quantity of the first dividing layers in each first trench is more than one, and a quantity of the second dividing layers in each second trench is more than one; a distance between adjacent first dividing layers along the first direction is greater than a distance between adjacent second dividing layers along the first direction; and a distance between the first dividing layer and the second dividing layer adjacent to the first dividing layer along the first direction is greater than a distance between adjacent second dividing layers along the first direction.

11. The method according to claim 1, wherein:
the first trench and the second trench are discrete.

12. The method according to claim 11, wherein:
a quantity of the first dividing layers in each first trench is one or more; and
when the quantity of the first dividing layers in each first trench is more than one, a distance between adjacent first dividing layers along the first direction is greater than a distance between adjacent second dividing layers along the first direction.

13. The method according to claim 1, wherein:
the layer to be etched includes a plurality of discrete first regions and a plurality of discrete second regions; the first regions and the second regions are alternatingly arranged along the second direction; a first region and a second region are adjoined with each other; the second direction is perpendicular to the first direction; the first trench and the second trench are on the first regions; and
the method further includes:
forming mask sidewall spacers on sidewalls of the first trench and the second trench;
after forming the mask sidewall spacers and removing the blocking layer, forming a third trench in the first mask layer of the second region; and
a sidewall of the third trench exposes a corresponding mask sidewall spacer.

14. The method according to claim 13, wherein:
after forming the mask sidewall spacers, the blocking layer is formed; or after removing the blocking layer, the mask sidewall spacers are formed; or when the mask sidewall spacers are formed, the first dividing layer and the second dividing layer are formed.

15. The method according to claim 13, further including:
etching the layer to be etched at bottoms of the first trench and the second trench to form first type target trenches in the layer to be etched; etching the layer to be etched at bottoms of third trenches to form second type target trenches in the layer to be etched; forming a first conductive layer in the first type target trenches; and forming a second conductive layer in the second type target trenches.

* * * * *